(12) United States Patent
Jiang et al.

(10) Patent No.: US 12,704,537 B2
(45) Date of Patent: Aug. 11, 2026

(54) WAVEGUIDE PROBE STRUCTURE, CALIBRATION DEVICE AND CALIBRATION METHOD FOR ANTENNA ARRAY

(71) Applicants: BOE TECHNOLOGY GROUP CO., LTD., Beijing (CN); Beijing BOE Sensor Technology Co., Ltd., Beijing (CN); Research Institute of Millimeter Wave and Terahertz Technology, Nanjing (CN)

(72) Inventors: Zhihao Jiang, Beijing (CN); Wenjin Gao, Beijing (CN); Meng Wei, Beijing (CN); Hongyuan Feng, Beijing (CN); Liangrong Ge, Beijing (CN); Xueyan Su, Beijing (CN); Yuanfu Li, Beijing (CN); Guo Liu, Beijing (CN); Fengshuo Wan, Beijing (CN); Xinyu Wu, Beijing (CN); Sheng Chen, Beijing (CN); Longzhu Cai, Beijing (CN); Zhifeng Zhang, Beijing (CN); Chuncheng Che, Beijing (CN); Wei Hong, Beijing (CN)

(73) Assignees: BOE TECHNOLOGY GROUP CO., LTD., Beijing (CN); Beijing BOE Sensor Technology Co., Ltd., Beijing (CN); Research Institute of Millimeter Wave and Terahertz Technology, Nanjing (CN)

( * ) Notice: Subject to any disclaimer, the term of this patent is extended or adjusted under 35 U.S.C. 154(b) by 229 days.

(21) Appl. No.: 18/686,973

(22) PCT Filed: Sep. 27, 2022

(86) PCT No.: PCT/CN2022/121733
§ 371 (c)(1),
(2) Date: Feb. 27, 2024

(87) PCT Pub. No.: WO2024/065177
PCT Pub. Date: Apr. 4, 2024

(65) Prior Publication Data

US 2024/0426889 A1 Dec. 26, 2024

(51) Int. Cl.
*G01R 29/08* (2006.01)
*G01R 29/10* (2006.01)

(52) U.S. Cl.
CPC ......... *G01R 29/10* (2013.01); *G01R 29/0878* (2013.01); *G01R 29/0892* (2013.01)

(58) Field of Classification Search
CPC . G01R 29/0878; G01R 29/0892; G01R 29/10
See application file for complete search history.

(56) References Cited

U.S. PATENT DOCUMENTS 4,219,777 A * 8/1980 Richardson ............ G01R 23/00 455/328
6,452,561 B1 * 9/2002 West .................. H01Q 13/0258 343/786
2020/0256908 A1 * 8/2020 Han ...................... G01R 1/045

FOREIGN PATENT DOCUMENTS

CN 111641464 A 9/2020
CN 113132029 A 7/2021
CN 114205009 A 3/2022

OTHER PUBLICATIONS

Bildik et al., "Reconfigurable folded reflectarray antenna based upon liquid crystal technology," IEEE Transactions on Antennas and Propagation, 2014, 63(1): 122-132.

(Continued)

*Primary Examiner* — Alesa Allgood

(57) ABSTRACT

A waveguide probe structure, a calibration device for an antenna array and a calibration method for an antenna array (Continued)

are provided. The waveguide probe structure includes a waveguide coaxial converter, a tapered waveguide and a first straight waveguide. The waveguide coaxial converter is configured to transmit and receive two orthogonal linearly-polarized signals; the tapered waveguide includes a first waveguide cavity including a first waveguide port and a second waveguide port, the first waveguide port is connected to the waveguide coaxial converter, the second waveguide port is connected to the first straight waveguide, and a size of a cross section of the first waveguide cavity increases monotonically in a direction from the first waveguide port to the second waveguide port; the first straight waveguide includes a second waveguide cavity, a size of a cross section of the second waveguide cavity is equal to a size of the second waveguide port.

17 Claims, 12 Drawing Sheets

(56) References Cited

OTHER PUBLICATIONS

Misran et al., “Design optimisation of ring elements for broadband reflectarray antennas,” Proceedings-Microwaves, Antennas and Propagation, 2003, 150(6): 440-444.
Bildik et al., “Tunable liquid crystal reflectarray with rectangular elements,” Conference Paper, German Microwave Conference, Digest of Papers, 2010: 1-4.
Hu et al., “Phase control of reflectarray patches using liquid crystal substrate,” Conference Pater, 2006 First European Conference on Antennas and Propagation, 2006: 1-6.

* cited by examiner

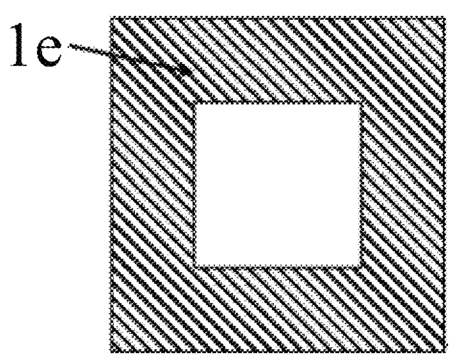

FIG. 7

Sequentially loading test voltages in the reference phase matching codebook to the in-array unit in the ith row and the jth column, so that the vector network analyzer acquires the network parameters of the in-array unit in the ith row and the jth column based on the relationship between the incident microwave and the reflected microwave — S11

Acquiring a first S parameter matrix based on the acquired network parameters of the in-array unit in the ith row and the jth column based on the relationship between the incident microwave and the reflected microwave — S12

Processing the first S parameter matrix to obtain a normalized S parameter matrix of the in-array unit in the ith row and the jth column under each test voltage, and determining a target voltage absolute phase response curve and a target voltage amplitude response curve corresponding to the in-array unit in the ith row and the jth column — S13

FIG. 8

WAVEGUIDE PROBE STRUCTURE, CALIBRATION DEVICE AND CALIBRATION METHOD FOR ANTENNA ARRAY

TECHNICAL FIELD

The present disclosure relates to the field of antenna technology, and in particular to a waveguide probe structure, a calibration device for an antenna array and a calibration method for an antenna array.

BACKGROUND

An adjustable reflective array antenna generally implements beam forming, beam scanning, and the like according to voltage-absolute phase response curves of reflective units. Because there are processing errors in the process for forming the reflective units, it is difficult to ensure the consistency among the reflective units in the reflective array antenna. For example, the reflective units have greatly different initial phases and greatly different phase shift ranges, that is, the voltage-absolute phase response curves of the reflective units are different. If the reflective array antenna performs a phase matching operation according to the voltage-absolute phase response curves with the errors in the reflective units, a phase matching error may be caused, which may cause the beam pointing not to be scanned as expected, for example, the beam being deformed, the gain being reduced, and even the beam cannot be not reconstructed.

SUMMARY

The present disclosure is directed to at least one of the technical problems in the prior art, and provides a calibration device for an antenna array and a calibration method for an antenna array.

In a first aspect, embodiments of the present disclosure provide a waveguide probe structure, including a waveguide coaxial converter, a tapered waveguide and a first straight waveguide; wherein the waveguide coaxial converter is configured to transmit and receive two linearly-polarized signals orthogonal to each other; the tapered waveguide includes a first waveguide cavity including a first waveguide port and a second waveguide port along a length direction of the first waveguide cavity, the first waveguide port is connected to the waveguide coaxial converter, the second waveguide port is connected to the first straight waveguide, and a size of a cross section of the first waveguide cavity increases monotonically in a direction from the first waveguide port to the second waveguide port; and the first straight waveguide includes a second waveguide cavity, and a size of a cross section of the second waveguide cavity is equal to a size of the second waveguide port.

In some embodiments, the waveguide coaxial converter includes a second straight waveguide, a first feeding port, a second feeding port, and an isolation component; feeding directions of the first feeding port and the second feeding port are orthogonal to each other, the second straight waveguide includes a third waveguide cavity, and the first feeding port, the second feeding port and the isolation component are all mounted on a side wall of the second straight waveguide and all extend into the third waveguide cavity, and the isolation component is between the first feeding port and the second feeding port and parallel to one of the first feeding port and the second feeding port.

In some embodiments, the waveguide probe structure further includes a first fixing component mounted on the side wall of the second straight waveguide and including a plurality of mounting holes therein.

In some embodiments, the first fixing component includes a flange.

In some embodiments, the waveguide coaxial converter is fixedly connected to the tapered waveguide through a second fixing component.

In some embodiments, the second fixing component includes a flange.

In some embodiments, a flare angle of the tapered waveguide is in a range from 1.5° to 2.5°.

In some embodiments, the waveguide probe structure further includes a spacer fixed on an end surface of the first straight waveguide away from the tapered waveguide.

In some embodiments, a length of the first straight waveguide is greater than a wavelength corresponding to a cut-off frequency of a microwave signal transmitted through the first straight waveguide.

In a second aspect, embodiments of the present disclosure provide a calibration device for an antenna array, including a waveguide probe structure, a vector network analyzer and a controller; the waveguide probe structure includes the waveguide probe structure of any one of the above embodiments; the vector network analyzer is configured to transmit the microwave signal to an in-array unit to be calibrated through the waveguide probe structure, receive the microwave signal reflected by the in-array unit and transmitted through the waveguide probe structure, and obtain network parameters of the in-array unit based on a relationship between an incident microwave and a reflected microwave through analysis according to the received microwave signal; and the controller is configured to process the network parameters of the in-array unit based on the relationship between the incident microwave and the reflected microwave obtained by the vector network analyzer through analysis, and obtain a calibration error through a preset algorithm.

In a third aspect, embodiments of the present disclosure provide a calibration method for an antenna array, the method employs the calibration device as above, the antenna array includes M×N in-array units, where one of M and N is a positive integer greater than or equal to 1, and the other one of M and N is a positive integer greater than or equal to 2; the method includes: sequentially calibrating the M×N in-array units based on a reference phase matching codebook acquired in advance, where the reference phase matching codebook includes a correspondence between test voltages and reference amplitudes as well as reference phases, respectively; calibrating an in-array unit in an ith row and a jth column includes: sequentially loading test voltages in the reference phase matching codebook to the in-array unit in the ith row and the jth column, and transmitting the microwave signal reflected by the in-array unit in the ith row and the jth column to the vector network analyzer through the waveguide probe structure after each test voltage is loaded, so that the vector network analyzer acquires the network parameters of the in-array unit in the ith row and the jth column based on the relationship between the incident microwave and the reflected microwave; where $0<i\leq M$, $0<j\leq N$, and i and j are positive integers; analyzing the network parameters of the waveguide probe structure and the in-array unit acquired by the vector network analyzer on the basis of the relationship between the incident microwave and the reflected microwave under different test voltages based on the in-array unit in the ith row and the jth column to obtain a first S parameter matrix; and processing, by the controller, the first S parameter matrix to obtain a normalized S parameter matrix of the in-array unit in the ith row and the jth column under each test voltage, and determining a target voltage absolute phase response curve and a target voltage amplitude response curve corresponding to the in-array unit in the ith row and the jth column, the normalized S parameter matrix is used for representing the network parameters of the in-array unit in the ith row and the jth column on the basis of the relationship between the incident microwave and the reflected microwave under the test voltage.

In some embodiments, the processing the first S parameter matrix to obtain the normalized S parameter matrix of the in-array unit in the ith row and the jth column under each test voltage includes: placing the waveguide probe structure above a reflective component, transmitting the microwave signal reflected by the reflective component to the vector network analyzer through the waveguide probe structure, so that the vector network analyzer obtains network parameters of the waveguide probe structure and the reflective component based on the relationship between the incident microwave signal and the reflected microwave signal through analysis; determining, by the vector network analyzer, a second S parameter matrix based on the network parameters of the waveguide probe structure and the reflective component based on the relationship between the incident microwave signal and the reflected microwave signal through analysis; and subtracting, by the controller, vectors of the first S parameter matrix from vectors of the second S parameter matrix to obtain the normalized S parameter matrix of the in-array unit in the ith row and the jth column under each test voltage.

In some embodiments, an operating mode of the antenna array is a circular polarization, and the determining the target voltage absolute phase response curve and the target voltage amplitude response curve corresponding to the in-array unit in the ith row and the jth column includes: performing a linear-circular polarization basis transformation on the normalized S parameter matrix, and determining the target voltage absolute phase response curve and the target voltage amplitude response curve corresponding to the in-array unit in the ith row and the jth column.

In some embodiments, the calibration method for an antenna array further includes obtaining a reference phase matching codebook; the reference phase matching codebook includes a correspondence response curve of the test voltages versus the reference phases of each in-array unit and a correspondence response curve of the test voltages versus the reference amplitudes of each in-array unit; acquiring a correspondence response curve of the test voltages versus the reference phases of the in-array unit in the ith row and the jth column and a correspondence response curve of the test voltages versus the reference amplitudes of the in-array unit in the ith row and the jth column includes: sequentially loading test voltages in a test voltage set acquired in advance to the in-array unit in the ith row and the jth column, placing the waveguide probe structure above the in-array unit in the ith row and the jth column, and obtaining, by the vector network analyzer, network parameters of the in-array unit in the ith row and the jth column and the waveguide probe structure based on the relationship between the incident microwave signal and the reflected microwave signal through the waveguide probe structure through analysis, to determine a first reference S parameter matrix; where $0<i\leq M$, $0<j\leq N$, and i and j are positive integers; placing the waveguide probe structure above a reflective component, and obtaining, by the vector network analyzer, network parameters of the reflective component and the waveguide probe structure on the basis of the relationship between the incident microwave and the reflected microwave through analysis, to determine a second reference S parameter matrix; and obtaining, by the controller, a normalized reference S parameter matrix based on the first reference S parameter matrix and the second reference S parameter matrix, processing the normalized reference S parameter matrix, and determining the correspondence response curve of the test voltages versus the reference phases of the in-array unit in the ith row and the jth column and the correspondence response curve of the test voltages versus the reference amplitudes of the in-array unit in the ith row and the jth column.

In some embodiments, the reflective component is made of copper or aluminum.

BRIEF DESCRIPTION OF DRAWINGS

FIG. 7 is a schematic diagram of a spacer of a waveguide probe structure according to an embodiment of the present disclosure.

FIG. 8 is a flowchart of a calibration method for an antenna array according to an embodiment of the present disclosure.

DETAIL DESCRIPTION OF EMBODIMENTS

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term "comprising", "including", or the like means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
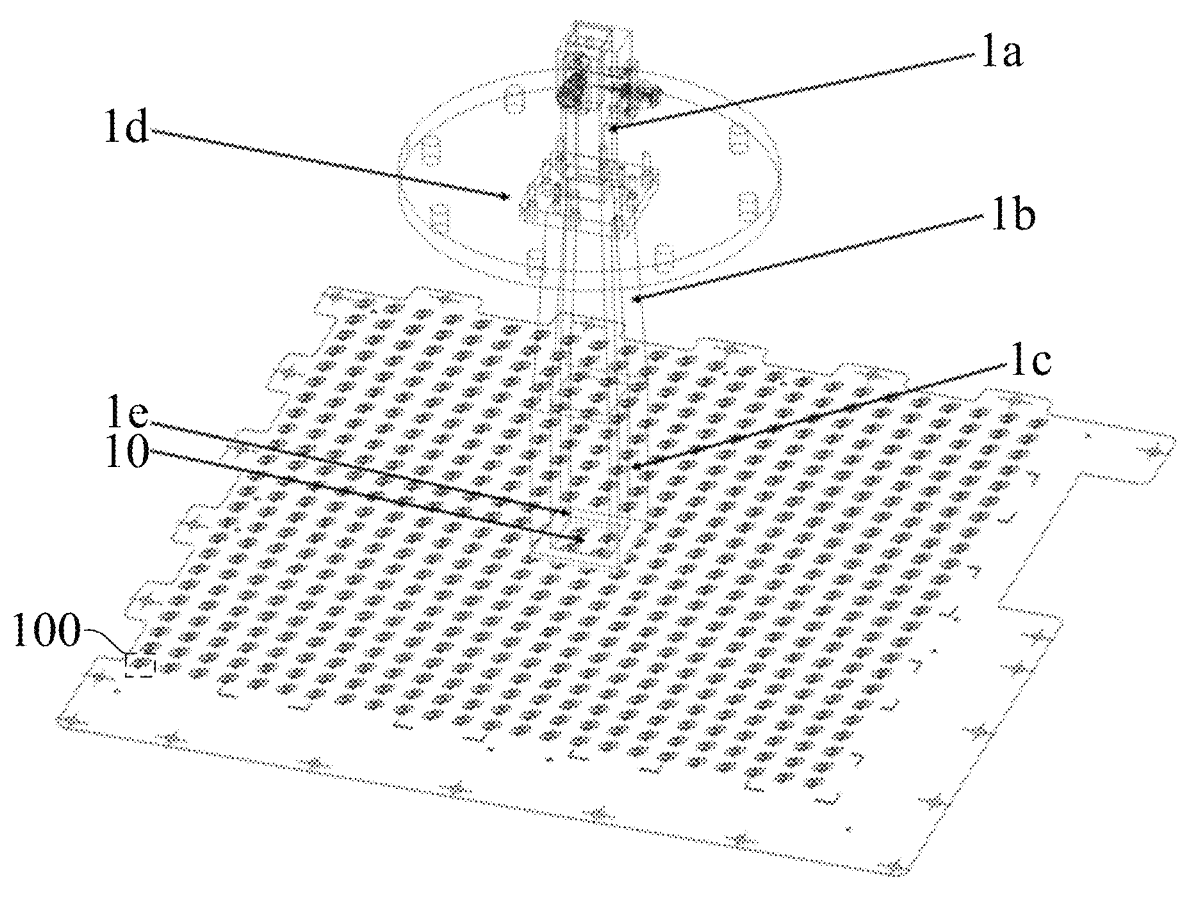
FIG. 1 is a schematic diagram of a waveguide probe structure disposed on an antenna array according to an embodiment of the present disclosure.

FIG. 1 is a schematic diagram of a waveguide probe structure disposed on an antenna array according to an embodiment of the present disclosure. As shown in FIG. 1, in the embodiment of the present disclosure, the antenna array may include M×N in-array units 10, each in-array unit 10 may include p×q in-array elements 100, one of M and N is a positive integer greater than or equal to 1, and the other one of M and N is a positive integer greater than or equal to 2; p and q are both integers greater than or equal to 2, and p=q=2 is taken as an example in the following description. However, it will be understood that this does not limit the scope of the embodiments of the present disclosure. The antenna array in the embodiment of the present disclosure is a reflective array, and each of the in-array elements 100 may include a phase adjustment unit and a radiation unit. The phase adjustment unit may shift the phase of the received microwave signal and radiate the microwave signal through reflective units, and the reflective units may receive the microwave signal and transmit the received microwave signal to the phase adjustment unit for phase shifting. The reflective units include, but are not limited to, reflective patches. The phase adjustment unit includes, but is not limited to, a phase shifter. In the embodiment of the present disclosure, as an example, the phase adjustment unit is a differential two-wire phase shifter. A tunable dielectric layer in the phase shifter includes, but is not limited to, a liquid crystal layer. In the embodiments of the present disclosure, as an example, the tunable dielectric layer is the liquid crystal layer.

Figure 2:
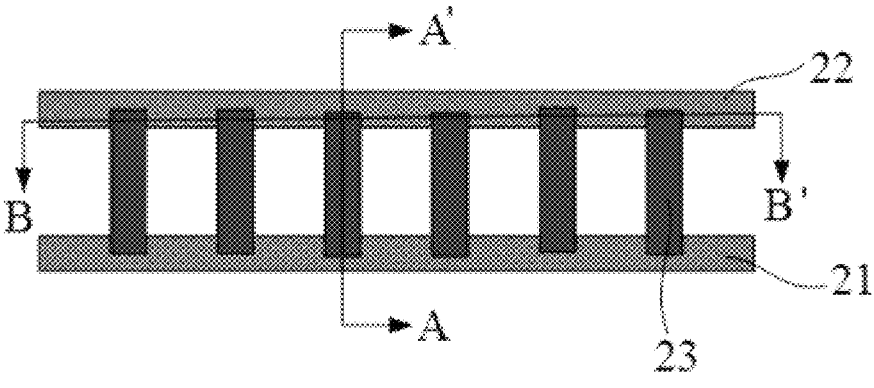
FIG. 2 is a top view of a phase shifter in an array according to an embodiment of the present disclosure.
Figure 3:
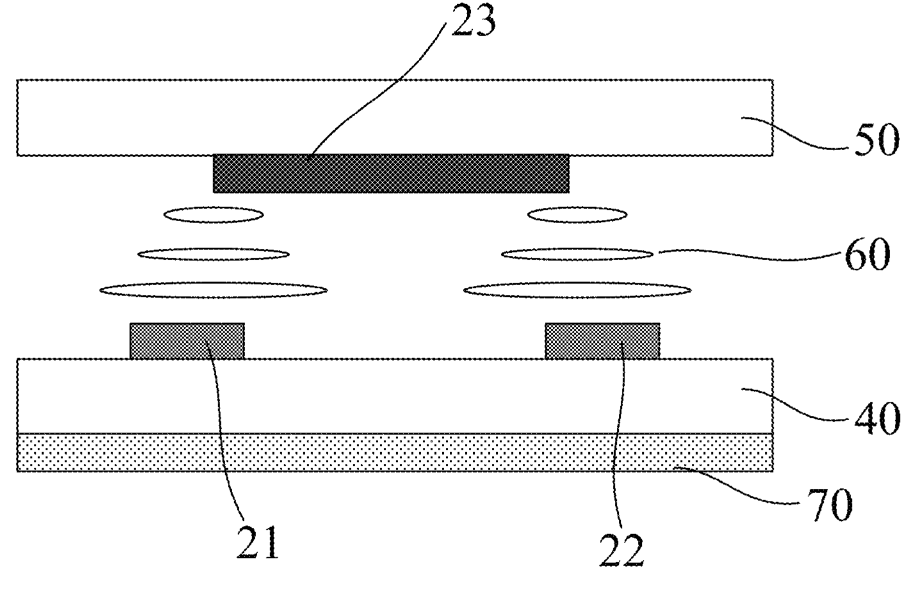
FIG. 3 is a cross-sectional view of the phase shifter along a line A-A' of FIG. 2.
Figure 4:
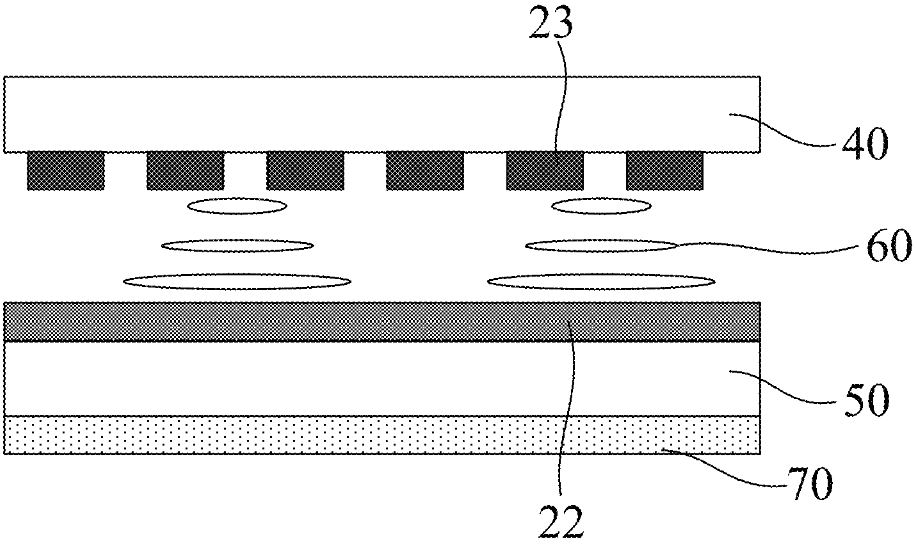
FIG. 4 is a cross-sectional view of the phase shifter along a line B-B' of FIG. 2.
Figure 5:
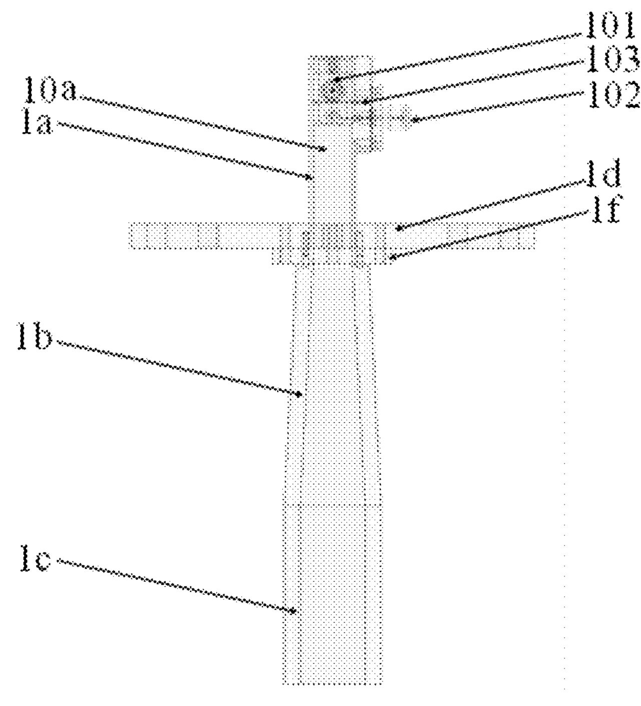
FIG. 5 is a front view of a waveguide probe structure according to an embodiment of the present disclosure.
Figure 6:
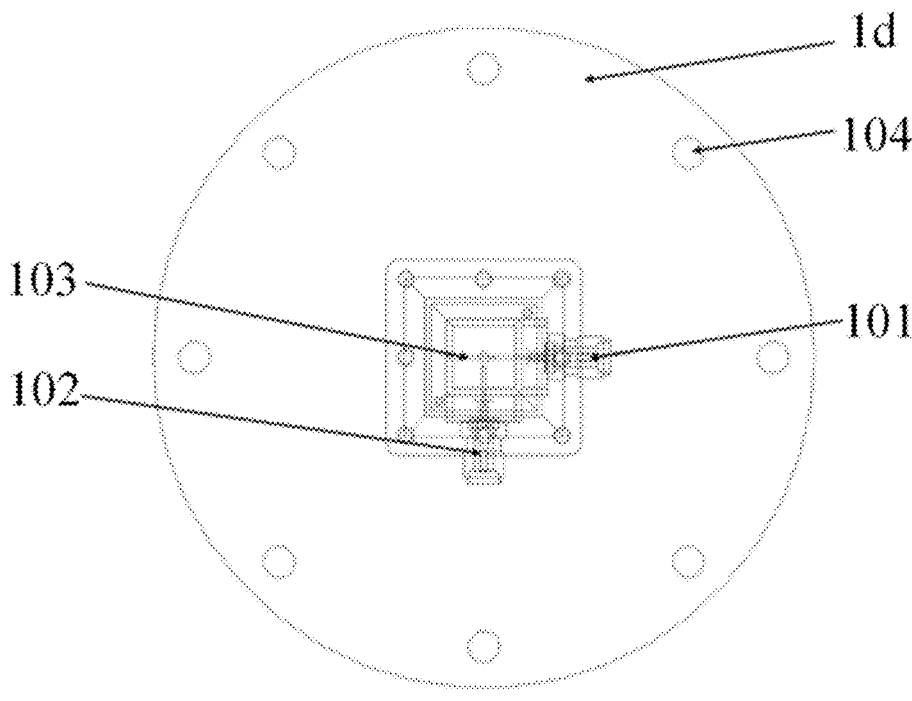
FIG. 6 is a top view of a waveguide probe structure according to an embodiment of the present disclosure.

FIG. 2 is a schematic diagram of a phase shifter in a first example according to an embodiment of the present disclosure; FIG. 3 is a cross-sectional view of the phase shifter along a line A-A' of FIG. 2. FIG. 4 is a cross-sectional view of the phase shifter along a line B-B' of FIG. 2. As shown in FIGS. 5 and 6, the phase shifter includes a first dielectric substrate 40 and a second dielectric substrate 50 which are oppositely disposed, a first main line 21, a second main line 22, a plurality of patch electrodes 23 disposed at intervals, and a liquid crystal layer 60. The liquid crystal layer 60 is formed between the first dielectric substrate 40 and the second dielectric substrate 50. The first main line 21 and the second main line 22 extend in the same direction, and are both disposed on a side of the first dielectric substrate 40 close to the liquid crystal layer 60. The patch electrodes 23 arranged at intervals are arranged side by side along an extending direction of the first main line 21, and on a side of the second dielectric substrate 50 close to the liquid crystal layer 60. Orthographic projections of two opposite ends of each patch electrode 23 in an extending direction of the patch electrode 23 on the first dielectric substrate 40 overlap with orthographic projections of the first main line 21 and the second main line 22 on the first dielectric substrate 40, respectively. In this case, a region where each of the first main line 21 and the second main line 22 overlaps with each patch electrode 23 form a capacitor region. Electric fields are formed in the regions where the first main line 21 and the second main line 22 overlap with the patch electrodes 23 by applying different voltages to the first main line 21, the second main line 22, and the patch electrodes 23, so that dielectric constants of liquid crystal molecules in the regions where the first main line 21 and the second main line 22 overlap with the patch electrodes 23 are changed, thereby achieving the phase shifting of the microwave signal.

It should be noted that, the phase shifter illustrated in FIGS. 3 and 4 further includes a reference electrode layer 70, and in practice, the operation of the phase shifter is not dependent on the reference electrode layer 70. When the phase shifter is integrated in an antenna, one or more reference electrode layers 70 are required. Alternatively, if the antenna itself is provided with a reference electrode layer 70, the reference electrode layer 70 of the phase shifter may be shared with the reference electrode layer 70 in the antenna. The reference electrode layer 70 may be disposed on a side of the first dielectric substrate 40 away from the liquid crystal layer 60, or on a side of the second dielectric substrate 50 away from the liquid crystal layer 60. In addition, the reference electrode layer 70 includes, but is not limited to, a ground layer. It is required that the reference electrode layer 70 may form a current loop with the first main line 21 and the patch electrodes 23, and a current loop with the second main line 22 and the patch electrodes 23. For a reflective array antenna, the reference electrode layer 70 may also serve as a reflective unit.

In some examples, the patch electrodes 23 in the phase shifter may be electrically connected together through a connection electrode. In the operation of the phase shifter, the patch electrodes 23 may be applied with the same bias voltage, thereby facilitating control. An orthographic projection of the connection electrode on the first dielectric substrate 40 does not overlap with the orthographic projections of the first main line 21 and the second main line 22 on the first dielectric substrate 40.

In some examples, the patch electrodes 23 in the phase shifter are arranged periodically. For example, a distance between every two adjacent patch electrodes 23 is constant. In some examples, areas of the regions where the orthographic projections of the patch electrodes 23 on the first dielectric substrate 40 overlap with the orthographic projections of the first main line 21 on the first dielectric substrate 40 are the same; and/or areas of the regions where the orthographic projections of the patch electrodes 23 on the first dielectric substrate 40 overlap with the orthographic projections of the second main line 22 on the first dielectric substrate 40 are the same. In this way, the phase shifter is easily controlled. Further, the patch electrodes 23 may have the same width, and the same length.

In some examples, the first main line 21 and the second main line 22 in the phase shifter may each employ a transmission line as a straight line segment. Extending direction of the first main line 21 and the second main line 22 may be parallel with each other in such a manner as to contribute to miniaturization of the phase shifter, and thus to the high integration of the antenna. Alternatively, the first main line 21 and the second main line 22 may also be curved, and shapes of the first main line 21 and the second main line 22 are not limited in the embodiment of the present disclosure.

The inventor finds that different portions of the liquid crystal layer have different thicknesses in the manufacturing process and the applied voltage is reduced as a length of a driving signal line is increased, which causes the non-uniform performance of the phase shifters in the array.

In view of the above technical problems, the following technical solutions are provided in the embodiments of the present disclosure.

FIG. 5 is a front view of a waveguide probe structure according to an embodiment of the present disclosure. FIG. 6 is a top view of a waveguide probe structure according to an embodiment of the present disclosure. FIG. 7 is a schematic diagram of a spacer 1*e* of a waveguide probe structure according to an embodiment of the present disclosure. As shown in FIGS. 1 and 5 to 7, the embodiment of the present disclosure provides a waveguide probe structure, which has an operating frequency of 17 GHz to 21 GHz partially located in the K band (18 GHz to 27 GHz). The waveguide probe structure is mainly used in a calibration method for the adjustable in-array unit 10, and transmits a microwave signal to the adjustable in-array unit 10 to be measured and receive a microwave signal reflected from the adjustable in-array unit 10 to be measured. A vector network analyzer analyzes the microwave signal received by the waveguide probe structure and the microwave signal transmitted by the waveguide probe structure to obtain network parameters based on a relationship between the incident microwave and the reflected microwave. And finally, the controller processes and analyzes the obtained network parameters based on the relationship between the incident microwave and the reflected microwave.

The waveguide probe structure includes a waveguide coaxial converter 1*a*, a tapered waveguide 1*b* and a first straight waveguide 1*c*. The waveguide coaxial converter 1*a* is configured to transmit and receive two linearly polarized signals orthogonal to each other. The tapered waveguide 1*b* is provided with a first waveguide cavity including a first waveguide port and a second waveguide port disposed opposite to each other along a length direction of the first waveguide cavity, and a size of a cross section of the first waveguide cavity increases monotonically in a direction from the first waveguide port to the second waveguide port, that is, a longitudinal section of the first waveguide cavity is horn-shaped. The first waveguide port of the first waveguide cavity is connected to the waveguide coaxial converter 1*a*, and the second waveguide port of the first waveguide cavity is connected to the first straight waveguide 1*c*. The first straight waveguide 1*c* is provided with a second waveguide cavity, and a size of the cross section of the second waveguide cavity is equal to the size of the second waveguide port.

It should be noted that the cross section of the first waveguide cavity refers to a cross section obtained by cutting the first waveguide cavity along a direction perpendicular to a length direction of the first waveguide cavity. The waveguide cavity of the tapered waveguide 1*b* fits the waveguide coaxial converter 1*a*, and the waveguide cavity of the first straight waveguide 1*c*. For example: the cross sections of the waveguide coaxial converter 1*a*, the waveguide cavities of the tapered waveguide 1*b* and the first straight waveguide 1*c* are all rectangular or circular or the like. As an example, the cross sections of the waveguide coaxial converter 1*a*, the waveguide cavities of the tapered waveguide 1*b* and the first straight waveguide 1*c* are all square in the embodiment of the present disclosure. The second waveguide cavity of the first straight waveguide 1*c* is a rectangular cavity, that is, sizes of cross sections of the second waveguide cavity at positions along a length direction of the second waveguide cavity are the same. When the cross section of each waveguide cavity is square, sizes of any two cross sections of the waveguide cavity at any two positions are the same, which means that lengths and widths of the two cross sections are the same. When the cross section of each waveguide cavity is circular, sizes of any two cross sections of the waveguide cavity at any two positions are the same, which means that diameters of the two cross sections are the same. When the cross section of each waveguide cavity is rectangular, a length of the cross section is twice a width of the cross section.

According to the waveguide probe structure provided by the embodiment of the present disclosure, the first straight waveguide 1*c* is provided on a side of the tapered waveguide 1*b* away from the waveguide coaxial converter 1*a*, so that the waveguide probe structure forms a stable operating mode of a main mode (a main mode operating mode).

In some examples, the waveguide coaxial converter 1*a* includes a second straight waveguide 10*a*, a first feeding port 101, a second feeding port 102, an isolation component 103. The second straight waveguide 10*a* is provided with a third waveguide cavity, and the third waveguide cavity is provided with a third waveguide port fitting the first waveguide cavity and connected to the first waveguide cavity. The first feeding port 101 and the second feeding port 102 are coaxial structures fed in two directions orthogonal to each other. The first feeding port 101, the second feeding port 102 and the isolation component 103 are all mounted on a side wall of one end of the second straight waveguide away from the third waveguide port, and extend into the third waveguide cavity. The isolation component 103 is located between the first feeding port 101 and the second feeding port 102, and is disposed parallel to one of the first feeding port 101 and the second feeding port 102. For example: the third straight waveguide includes a first side wall, a second side wall, a third side wall and a fourth side wall which are sequentially connected along the clockwise direction, the first feeding port 101 is mounted on the first side wall and extends into the third waveguide cavity, and the second feeding port 102 and the isolation component 103 are mounted on the second side wall 102 and extend into the third waveguide cavity. For example: the first feeding port 101 and the second feeding port 102 both are provided with probes, and an intersection point of an extending structure of the probe of the first feeding port 101 and an axis of the third waveguide cavity is a first intersection point, an intersection point of an extending structure of the probe of the second feeding port 102 and the axis of the third waveguide cavity is a second intersection point, an intersection point of an extending structure of the isolation component 103 and the axis of the third waveguide cavity is a third intersection point, the third intersection point is located between the first intersection point and the second intersection point, and the second intersection point is closer to the third waveguide port than the first intersection point. Further, the isolation component 103 traverses the third waveguide cavity. The coupling between the first feeding port 101 and the second feeding port 102 can be effectively reduced by disposing the isolation component 103. The isolation component 103 may be cylindrical and may be made of a desired conductive material, such as a good conductor of metal, e.g., copper, aluminum or the like.

Further, the length of the first waveguide cavity is matched with an operating frequency band in a range from 17 GHz to 21 GHz partially in the K band, and a side wall of the first waveguide cavity is made of a metal material with a certain thickness. For example, a thickness of the side wall of the first waveguide cavity is 4 mm.

Further, a first fixing component 1*d* is further mounted on the side wall of the second straight waveguide and used for fixing an external device such as a motor, a support and the like to control a position of the waveguide probe structure. For example: the first fixing component 1*d* is provided with mounting holes 104 for fixing the external devices. In one example, the first fixing component 1*d* may be a flange, for example, a circular flange, and the mounting holes 104 may be uniformly arranged along a circumference of the circular flange.

Further, the waveguide coaxial converter 1*a* and the tapered waveguide 1*b* may be fixed together by a second fixing component 1*f*. Specifically, the second fixing component 1*f* may be fixed on a side wall of the tapered waveguide 1*b*, and is then fixedly connected to the first fixing component 1*d*. For example: the second fixing component 1*f* may be fixed on the first fixing component 1*d* by screws. In one example, the second fixing component 1*f* may be a flange, such as a square flange, and the square flange may be fixed on the first fixing component 1*d* as the circular flange by screws.

In some examples, the function of the tapered waveguide 1*b* is to fit the third waveguide port of the second straight waveguide to a boundary of a sub-array unit to be measured. The longitudinal section of the tapered waveguide 1*b* is horn-shaped, and the side wall of the tapered waveguide 1*b* is metal with a thickness. For example: the thickness of the side wall of the tapered waveguide 1*b* was 4 mm. Further, a flare angle of the tapered waveguide 1*b* is in a range from about 1.5° to about 2.5°, such as 2°.

In some examples, the second waveguide cavity of the first straight waveguide 1*c* is provided with a fourth waveguide port and a fifth waveguide port oppositely arranged along the length direction of the second waveguide cavity, and the second waveguide port of the first waveguide cavity is connected to the fourth waveguide port of the second waveguide cavity and has the same size as the fourth waveguide port. When the waveguide probe structure transmits microwave signals to the in-array unit 10, the fifth waveguide port faces the in-array unit 10, and fits the edge of the in-array unit 10 and covers the in-array unit 10, to measure the average reflection response characteristics of a plurality of in-array elements 100 in the in-array unit 10. For example: when each in-array unit 10 includes 2×2 in-array elements 100 and the fifth waveguide port is square, an inner side length of the fifth waveguide port is equal to the length of two in-array elements 100. When the size of the in-array unit 10 is increased, for example, when each in-array unit 10 includes 3×3 or 4×4 in-array elements 100, in order to shorten the extraction time of the characteristics of the in-array unit 10, the size of the corresponding fifth waveguide port is relatively increased compared to the case where each in-array unit 10 includes 2×2 in-array elements 100, that is, the size of the second waveguide port of the tapered waveguide 1*b* is correspondingly increased. When each in-array unit 10 includes 3×3 in-array elements 100 and the fifth waveguide port is square, the inner side length of the fifth waveguide port is equal to the length of three in-array elements 100. When each in-array unit 10 includes 4×4 in-array elements 100 and the fifth waveguide port is square, the inner side length of the fifth waveguide port is equal to the length of four in-array elements 100. In the above two cases, the sizes of the third waveguide port of the second straight waveguide and the first waveguide port of the tapered waveguide 1*b* are not changed as compared with the case where each in-array unit 10 includes 2×2 in-array elements 100.

Further, an incident angle of the microwave signal corresponding to the main mode operating mode in the waveguide may be calculated by using the following formula.

$$\theta = \cos^{-1}\left(\sqrt{1-\left(\frac{\lambda}{2a}\right)^2}\right)$$

Where λ is a wavelength corresponding to the operating frequency, and a is a side length of the fifth waveguide port of the first straight waveguide 1*c*.

Further, the side wall of the first straight waveguide 1*c* is a metal having a wall thickness. For example: the thickness of the side wall of the first straight waveguide 1*c* is 4 mm. The first straight waveguide 1*c* functions to form a stable main mode operation mode. The tapered waveguide 1*b* has discontinuity in microwave signal transmission. In order to reduce or even eliminate the influence of the discontinuity on the reflection response of the units, the length of the first straight waveguide 1*c* should be longer than the wavelength corresponding to a cut-off frequency. For example: the length of the first straight waveguide 1*c* is 45 mm.

In some examples, the waveguide probe structure of the embodiment of the present disclosure may include not only the above structure, but also a spacer 1*e*. The spacer 1*e* is fixed on an end surface of the first straight waveguide 1*c* away from the tapered waveguide 1*b*. For example: the spacer 1*e* is fixed on the end surface of the first straight waveguide 1*c* away from the tapered waveguide 1*b* by a conductive adhesive. It should be noted that the spacer 1*e* is ring-shaped, an opening of the spacer corresponds to the waveguide cavity of the first straight waveguide 1*c*, and a size of a solid portion of the spacer 1*e* (a portion of the spacer 1*e* without the opening) fits the thickness of the side wall of the first straight waveguide 1*c*. In the embodiment of the present disclosure, the spacer 1*e* is adhered to the end surface of the first straight waveguide 1*c* away from the tapered waveguide 1*b*, so that the surface of the antenna array can be effectively prevented from being scratched when the measurement is performed through the waveguide probe structure. In addition, when different in-array units 10 are measured, only the waveguide probe structure needs to be moved above the surface of the antenna array, and the waveguide probe structure is not required to be lifted.

Further, the spacer 1*e* is a conductive elastic spacer 1*e* having a certain thickness, and the thickness of the spacer 1*e* may be 1.57 mm. The thickness of the spacer 1*e* may alternatively be selected according to specific test requirements. The spacer 1*e* is a conductive elastomer which acts as a waveguide lining material, and is made of a conductive rubber.

The embodiment of the present disclosure further provides a calibration device for an antenna array, which includes a waveguide probe structure, a vector network analyzer, and a controller. The waveguide probe structure may adopt the structure in any one of the above embodiments. The vector network analyzer is configured to transmit the microwave signal to the in-array unit 10 to be calibrated through the waveguide probe structure, receive the microwave signal reflected by the in-array unit 10 and transmitted through the waveguide probe structure, and obtain network parameters of the in-array unit 10 based on a relationship between the incident microwave and the reflected microwave through analysis according to the received microwave signal. The controller is configured to process the network parameters based on the relationship between the incident microwave and the reflected microwave obtained by the vector network analyzer through analysis, and obtain a calibration error through a preset algorithm.

The embodiment of the present disclosure provides a calibration method for an antenna array, which uses the above calibration device. It should be noted that in this calibration method, as an example, the waveguide probe structure is provided with two feeding ports connected to the vector network analyzer, that is, the waveguide probe structure includes the first feeding port 101 and the second feeding port 102. The antenna array calibrated by the calibration method includes M×N in-array units 10, and each in-array unit 10 may include p×q in-array elements 100. M and N are both 12, and p and q are both 2. That is, the antenna array includes 576 in-array elements 100, i.e., 576 phase shifters.

The calibration method for an antenna array of the embodiment of the present disclosure includes: calibrating the M×N in-array units 10 based on a reference phase matching codebook acquired in advance. The reference phase matching codebook includes a correspondence between test voltages and amplitudes as well as phases, respectively. For example: the reference phase matching codebook includes a correspondence response curve of test voltages versus reference phases (a response curve illustrating the correspondence between the test voltages and the reference phases) and a correspondence response curve of test voltages versus reference amplitude. FIG. 8 is a flowchart of a calibration method for an antenna array according to an embodiment of the present disclosure. As shown in FIG. 8, a step of calibrating an in-array unit 10 in an ith row and a jth column includes steps S11 to S13.

The step S11 includes sequentially loading the test voltages in the reference phase matching codebook to the in-array unit 10 in the ith row and the jth column, and transmitting the microwave signal reflected by the in-array unit 10 in the ith row and the jth column to the vector network analyzer through the waveguide probe structure after each test voltage is loaded, so that the vector network analyzer acquires the network parameters of the in-array unit 10 in the ith row and the jth column based on the relationship between the incident microwave signal and the reflected microwave signal; 0<i≤M, 0<j≤N, and i and j are positive integers.

It should be noted that applying a test voltage to the in-array unit 10 in the ith row and the jth column means applying the test voltage to a phase shifter of each of the in-array elements 100 in the in-array unit 10, that is, a difference between voltages applied to a first electrode layer and a second electrode layer of the phase shifter is the test voltage. Under different test voltages, the phase shifter causes different phase shift angles, namely different phases and amplitudes, for the microwave signal.

In some examples, the step S11 may include sequentially applying the test voltages in the reference phase matching code book to the in-array unit 10 in the ith row and the jth column, and transmitting, by the vector network analyzer, a microwave signal (e.g., in a range from 17 GHz to 21 GHz partially in the K band) of a specific band to the in-array unit 10 in the ith row and the jth column through the first feeding port 101 and the second feeding port 102 of the waveguide probe structure after each test voltage being applied; phase shifting and reflecting, by the in-array unit 10 in the ith row and the jth column, the microwave signal; and acquiring, by the vector network analyzer, a phase and an amplitude of the phase shifted microwave signal through the first feeding port 101 and the second feeding port 102 of the waveguide probe structure, so as to obtain the network parameters based on the relationship between the incident microwave and the reflected microwave.

Figure 9:
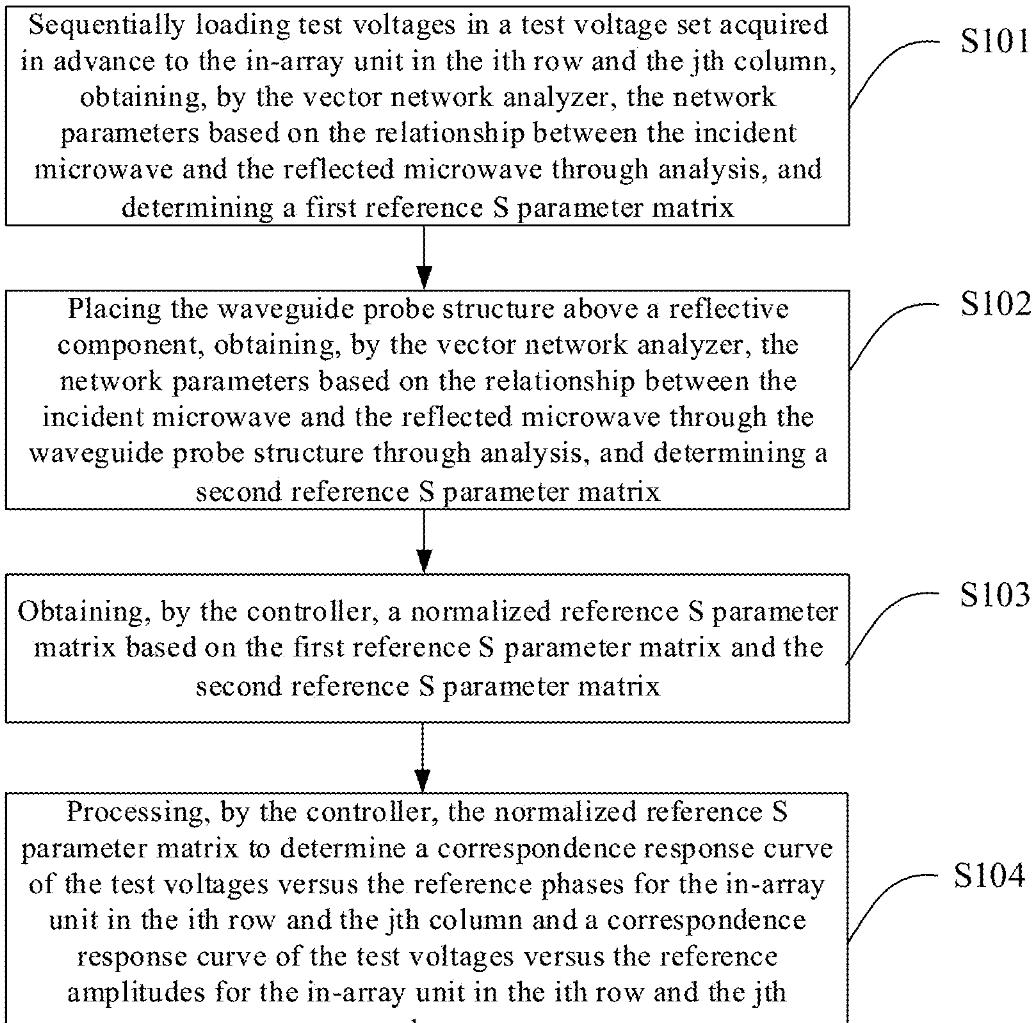
FIG. 9 is a flowchart of acquiring a reference phase matching codebook in a calibration method for an antenna array according to an embodiment of the present disclosure.

In some examples, the calibration method in the embodiments of the present disclosure may include step S10 of acquiring the reference phase matching codebook at a specific beam angle. The reference phase matching codebook includes a correspondence response curve of the test voltages versus the reference amplitudes and a correspondence response curve of the test voltages versus the reference phases for each in-array unit 10. The correspondence response curve of the test voltages versus the reference phases and the correspondence response curve of the test voltages versus the reference amplitudes for the in-array unit 10 in the ith row and the jth column may be obtained by the following steps S101 to S104, as shown in FIG. 9.

The step S101 includes sequentially loading test voltages in a test voltage set acquired in advance to the in-array unit 10 in the ith row and the jth column, placing the waveguide probe structure above the in-array unit 10 in the ith row and the jth column, transmitting, by the vector network analyzer, a microwave signal (e.g., in a range from 17 GHz to 21 GHz partially in the K band) of a specific band to the in-array unit 10 in the ith row and the jth column through the first feeding port 101 and the second feeding port 102 of the waveguide probe structure after each test voltage being applied, reflecting, by the in-array unit 10 in the ith row and the jth column, the phase shifted microwave signal, acquiring, by the vector network analyzer, the phase shifted microwave signal through the first feeding port 101 and the second feeding port 102 of the waveguide probe structure, obtaining the network parameters of the waveguide probe structure and the in-array unit 10 in the ith row and the jth column based on the relationship between the incident microwave and the reflected microwave through analysis, and determining a first reference S parameter matrix. The first reference S parameter matrix includes a first reference phase S parameter matrix $$S_{RA}^{mag}$$

and a first reference amplitude S parameter matrix $$S_{RA}^{pha},$$

see the following formulas (1) and (2).

$$S_{RA}^{mag} = \begin{bmatrix} s_{11}^{mag} & \frac{s_{11}^{mag} + s_{22}^{mag}}{2} \\ \frac{s_{11}^{mag} + s_{22}^{mag}}{2} & s_{22}^{mag} \end{bmatrix}_{RA(relative\ unit:\ dB)} \quad (1)$$

$$S_{RA}^{pha} = \begin{bmatrix} s_{11}^{pha} & \frac{s_{11}^{pha} + s_{22}^{pha}}{2} \\ \frac{s_{11}^{pha} + s_{22}^{pha}}{2} & s_{22}^{pha} \end{bmatrix}_{RA(relative\ unit:\ deg)} \quad (2)$$

Where $$S_{11}^{mag}$$

in the above formula represents a ratio of a phase of the microwave signal transmitted through the first feeding port 101 and an amplitude of the microwave signal reflected by the in-array unit 10 received through the first feeding port 101, which are obtained by the vector network analyzer;

$$S_{22}^{mag}$$

represents a ratio of a phase of the microwave signal transmitted through the second feeding port 102 and the amplitude of the microwave signal reflected by the in-array unit 10 received through the second feeding port 102, which are obtained by the vector network analyzer;

$$S_{11}^{pha}$$

represents a phase difference between an amplitude of the microwave signal transmitted through the first feeding port 101 and the microwave signal reflected by the in-array unit 10 received through the first feeding port 101, which are obtained by the vector network analyzer;

$$S_{22}^{pha}$$

represents a phase difference between an amplitude of the microwave signal transmitted through the second feeding port 102 and the microwave signal reflected by the array unit 10 received through the second feeding port 102, which are obtained by the vector network analyzer.

The test voltage set may include 53 voltage values each in a range from 0V to 16.5V.

In some examples, the waveguide probe structure may be in contact with the antenna array in the step S101, that is, the waveguide port of the waveguide probe structure covers the in-array unit 10 in the ith row and the jth column. Alternatively, the waveguide probe structure may alternatively have a distance from the antenna array in the step S101, as long as an orthographic projection of the waveguide probe structure on the first dielectric substrate covers a region where the in-array unit 10 in the ith row and the jth column is located (and cannot cover regions where other in-array units 10 are located). It should be noted that the distance between the waveguide probe structure and the antenna array should not be too great, preferably, not greater than 0.5 mm.

The step S102 includes placing the waveguide probe structure above a reflective component; transmitting, by the vector network analyzer, a microwave signal (e.g., in a range from 17 GHz to 21 GHz partially in the K band) of a specific band to the reflective component through the first feeding port 101 and the second feeding port 102 of the waveguide probe structure, reflecting, by the reflective component, the microwave signal, acquiring, by the vector network analyzer, the microwave signal through the first feeding port 101 and the second feeding port 102 of the waveguide probe structure, obtaining the network parameters of the waveguide probe structure and the reflective component based on the relationship between the incident microwave and the reflected microwave through analysis, and determining a second reference S parameter matrix. The second reference S parameter matrix includes a second reference phase S parameter matrix $$S_{PEC}^{mag}$$

and a second reference amplitude S parameter matrix $$S_{PEC}^{pha},$$

see the following formulas (3) and (4).

$$S_{PEC}^{mag} = \begin{bmatrix} s_{11}^{mag} & \frac{s_{11}^{mag} + s_{22}^{mag}}{2} \\ \frac{s_{11}^{mag} + s_{22}^{mag}}{2} & s_{22}^{mag} \end{bmatrix}_{PEC(relative\ unit:\ dB)} \quad (3)$$

$$S_{PEC}^{pha} = \begin{bmatrix} s_{11}^{pha} & \frac{s_{11}^{pha} + s_{22}^{pha}}{2} \\ \frac{s_{11}^{pha} + s_{22}^{pha}}{2} & s_{22}^{pha} \end{bmatrix}_{PEC(unit:\ deg)} \quad (4)$$

The step S103 includes obtaining, by the controller, a normalized reference S parameter matrix based on the first reference S parameter matrix and the second reference S parameter matrix. In some examples, the step S103 specifically includes subtracting vectors of the first reference S parameter matrix from vectors of the second reference S parameter matrix to obtain the normalized reference S parameter matrix. The normalized reference S parameter matrix includes a normalized reference amplitude S parameter matrix $$S_{Norm}^{mag}$$

(see the following formula (5)) and a normalized reference phase S parameter matrix $$S_{Norm}^{pha}$$

(see the following formula (6)).

$$S_{Norm}^{mag}=S_{RA}^{mag}-S_{PEC}^{mag}=\begin{bmatrix}(s_{11}^{mag})_{RA}-(s_{11}^{mag})_{PEC} & \left(\frac{s_{11}^{mag}+s_{22}^{mag}}{2}\right)_{RA}-\left(\frac{s_{11}^{mag}+s_{22}^{mag}}{2}\right)_{PEC}\\ \left(\frac{s_{11}^{mag}+s_{22}^{mag}}{2}\right)_{RA}-\left(\frac{s_{11}^{mag}+s_{22}^{mag}}{2}\right)_{PEC} & (s_{22}^{mag})_{RA}-(s_{22}^{mag})_{PEC}\end{bmatrix} \quad (5)$$

$$S_{Norm}^{pha}=S_{RA}^{pha}-S_{PEC}^{pha}=\begin{bmatrix}(s_{11}^{pha})_{RA}-(s_{11}^{pha})_{PEC} & \left(\frac{s_{11}^{pha}+s_{22}^{pha}}{2}\right)_{RA}-\left(\frac{s_{11}^{pha}+s_{22}^{pha}}{2}\right)_{PEC}\\ \left(\frac{s_{11}^{pha}+s_{22}^{pha}}{2}\right)_{RA}-\left(\frac{s_{11}^{pha}+s_{22}^{pha}}{2}\right)_{PEC} & (s_{22}^{pha})_{RA}-(s_{22}^{pha})_{PEC}\end{bmatrix} \quad (6)$$

In the embodiment of the present disclosure, the first reference S parameter matrix is normalized through the second reference S parameter matrix, so as to obtain the normalized reference S parameter matrix. In this way, the influence from the waveguide probe structure itself can be eliminated, so that the determined characteristics are only the network parameters of the in-array unit in the ith row and the jth column based on the relationship between incident and reflected microwave signals.

The step S104 includes processing, by the controller, the normalized reference S parameter matrix to determine a correspondence response curve of the test voltages and versus the reference phases for the in-array unit 10 in the ith row and the jth column and a correspondence response curve of the test voltages versus the reference amplitude for the in-array unit 10 in the ith row and the jth column.

In some examples, the step S104 may include changing the relative unit of the normalized reference amplitude S parameter matrix from the logarithmic form to a linear form $$(S_{Norm}^{mag})_{linear}$$

(see the following formula (7)), and changing the unit of the normalized reference phase S parameter matrix from the angular form to a radian form $$(S_{Norm}^{pha})_{radian}$$

(see the following formula (8)), thereby obtaining the normalized reference S parameter matrix in a complex form $$S_{Norm}$$

(see the following formula (9)) corresponding to a linear polarization direction.

$$(S_{Norm}^{mag})_{linear}=\log_{10}=\left(\frac{(S_{Norm}^{mag})_{dB}}{20}\right)=\begin{bmatrix}s_{11}^{mag} & s_{12}^{mag}\\ s_{21}^{mag} & s_{22}^{mag}\end{bmatrix}_{Norm} \quad (7)$$

$$(S_{Norm}^{pha})_{radian}=\frac{\pi}{180}\cdot(S_{Norm}^{pha})_{dB}=\begin{bmatrix}s_{11}^{pha} & s_{12}^{pha}\\ s_{21}^{pha} & s_{22}^{pha}\end{bmatrix}_{Norm} \quad (8)$$

$$S_{Norm}=\begin{bmatrix}s_{11}^{mag}\cdot e^{j\omega s_{11}^{pha}} & s_{12}^{mag}\cdot e^{j\omega s_{12}^{pha}}\\ s_{21}^{mag}\cdot e^{j\omega s_{21}^{pha}} & s_{22}^{mag}\cdot e^{j\omega s_{22}^{pha}}\end{bmatrix}_{Norm}=\begin{bmatrix}r_{XY} & r_{XY}\\ r_{YX} & r_{YY}\end{bmatrix} \quad (9)$$

If the operating mode of the antenna array is a linear polarization, the correspondence response curve of the test voltages versus the reference phases for the in-array unit 10 in the ith row and the jth column and the correspondence response curve of the test voltages versus the reference amplitudes for the in-array unit 10 in the ith row and the jth column may be determined according to the normalized reference S parameter matrix in the complex form.

If the operation mode of the antenna array is a circular polarization, the correspondence response curve of the test voltages versus the reference phases for the in-array unit 10 in the ith row and the jth column and the correspondence response curve of the test voltages versus the reference amplitudes for the in-array unit 10 in the ith row and the jth column are determined based on a linear-circular polarization basis transformation (see the following formula (10)).

$$\begin{bmatrix}r_{RR} & r_{RL}\\ r_{LR} & r_{LL}\end{bmatrix}=\begin{bmatrix}\frac{(r_{XX}-r_{YY})+j(r_{XY}+r_{YX})}{2} & \frac{(r_{XX}-r_{YY})-j(r_{XY}+r_{YX})}{2}\\ \frac{(r_{XX}+r_{YY})+j(r_{XY}-r_{YX})}{2} & \frac{(r_{XX}-r_{YY})-j(r_{XY}+r_{YX})}{2}\end{bmatrix} \quad (10)$$

It should be noted that in the process of acquiring the reference phase matching codebook, if a problem exists in an in-array unit 10 (the in-array unit 10 is defective) according to the obtained correspondence response curve of the test voltages versus the reference phases for the in-array unit 10 and the obtained correspondence response curve of the test voltages versus the reference amplitudes for the in-array unit 10, the above test needs to be performed with in-array elements 100 arranged adjacent to the in-array unit 10, to determine the defective in-array element. For example: the in-array unit 10 includes four in-array elements, and each in-array element of this in-array unit 10 and its adjacent in-array elements of one or more different in-array units 10 together form a 2×2 in-array unit 10, the test is then performed on this 2×2 in-array unit 10 in the above manner to obtain the correspondence response curve of the test voltages versus the reference phases and the correspondence response curve of the test voltages versus the reference amplitudes, so as to determine whether the problem exists in the in-array element 100. The defective in-array element 100 is deleted in any subsequent calibration process, and the undefective in-array element 100 in the in-array unit 10 may form another in-array unit 10 together with the adjacent in-array elements 100 in the above manner for calibration.

The step S12 includes analyzing phases and amplitudes of the microwave signals acquired by the vector network analyzer under different test voltages based on the in-array unit 10 in the ith row and the jth column to obtain a first S parameter matrix.

It should be noted that the vector network analyzer may acquire the phase and the amplitude of the microwave signal in the network parameters based on the relationship between the incident microwave and the reflected microwave, so the first S parameter matrix obtained through analysis includes a first phase S parameter matrix and a first amplitude S parameter matrix.

In some examples, the first phase S parameter matrix and the first amplitude S parameter matrix obtained through analysis by the vector network analyzer in the step S12 may be the same as those in the step S101, and thus are not repeated herein.

The step S13 includes processing the first S parameter matrix to obtain a normalized S parameter matrix of the in-array unit in the ith row and the jth column under each test voltage, and determining a target voltage absolute phase response curve and a target voltage amplitude response curve corresponding to the in-array unit in the ith row and the jth column. The normalized S parameter matrix is used for representing the network parameters (a reference phase and a reference amplitude of the microwave signal) of the in-array unit 10 in the ith row and the jth column on the basis of the relationship between the incident microwave and the reflected microwave under the test voltages.

In some examples, the step S13 may include the following steps S131 to S133.

The step S131 includes placing the waveguide probe structure above the reflective component; transmitting, by the vector network analyzer, a microwave signal (e.g., in a range from 17 GHz to 21 GHz partially in the K band) of a specific band to the reflective component through the first feeding port 101 and the second feeding port 102 of the waveguide probe structure; reflecting, by the reflective component, the microwave signal; acquiring, by the vector network analyzer, the phase shifted microwave signal through the first feeding port 101 and the second feeding port 102 of the waveguide probe structure; obtaining the phase and the amplitude of the microwave signal through analysis; and determining a second S parameter matrix.

The manner of determining the second S parameter matrix by the vector network analyzer is the same as that in the step S102, and thus, the description is not repeated here.

The step S132 includes obtaining, by the controller, a normalized S parameter matrix based on the first S parameter matrix and the second S parameter matrix. In some examples, the step S132 specifically includes subtracting vectors of the first S parameter matrix from vectors of the second S parameter matrix to obtain the normalized S parameter matrix. The normalized S parameter matrix includes a normalized phase S parameter matrix and a normalized amplitude S parameter matrix.

In some examples, in the step S132, the normalized phase S parameter matrix and the normalized amplitude S parameter matrix obtained through the processing of the controller may be the same as in the step S103, and thus are not repeated herein.

The step S133 includes processing, by the controller, the normalized S parameter matrix to determine the correspondence response curve of the test voltages versus the reference phases for the in-array unit 10 in the ith row and the jth column and the correspondence response curve of the test voltages versus the reference amplitudes for the in-array unit 10 in the ith row and the jth column.

In some examples, the step S13 may include changing the relative unit of the normalized amplitude S parameter matrix from the logarithmic form to the linear form, changing the unit of the normalized phase S parameter matrix from the angular form to the radian form, and then obtaining the normalized S parameter matrix in the complex form corresponding to the linear polarization direction.

If the operating mode of the antenna array is the linear polarization, a correspondence response curve of the test voltages versus the phases for the in-array unit 10 in the ith row and the jth column and a correspondence response curve of the test voltages versus the amplitudes may be determined according to the normalized S parameter matrix in the complex form.

If the operation mode of the antenna array is the circular polarization, the correspondence response curve of the test voltages versus the phases for the in-array unit 10 in the ith row and the jth column and the correspondence response curve of the test voltages and the amplitudes for the in-array unit 10 in the ith row and the jth column are determined based on the linear-circular polarization basis transformation.

By comparing the obtained correspondence response curve of the test voltages versus the phases with the correspondence response curve of the test voltages versus the reference phases in the reference phase matching codebook, a phase error distribution of each of the in-array units 10 may be obtained. By comparing the obtained correspondence response curve of the test voltages versus the amplitudes with the correspondence response curve of the test voltages versus the reference amplitudes in the reference phase matching codebook, an amplitude error distribution of each of the in-array units 10 may be obtained.

In some examples, the calibration method for an antenna array according to the embodiments of the present disclosure further includes calibrating a phase shift degree of each in-array element of the antenna array to 0° before the step S11, so as to level the initial phases, which ensures the accuracy of the pure phase shift matching using the relative phase shift curve subsequently.

Figure 10A:
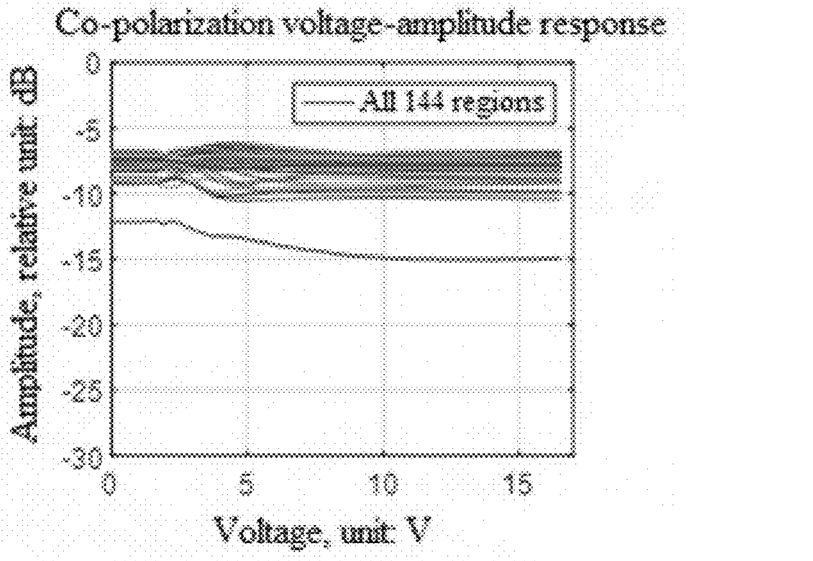
FIG. 10*a* is a voltage-amplitude response curve of a main polarization (right-hand circular polarization) for an antenna array operating in the right-hand circular polarization at an operating frequency of 19.725 GHz.
Figure 10B:
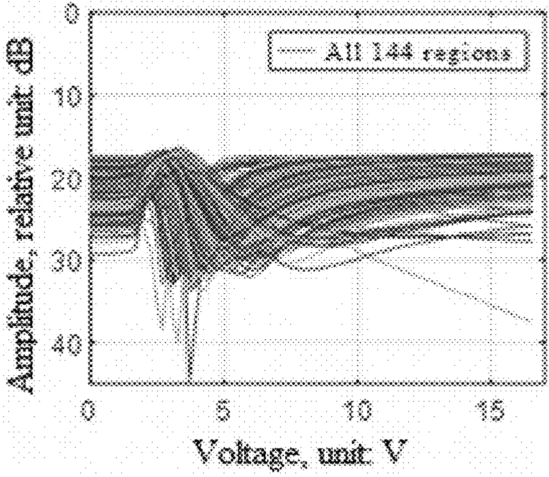
FIG. 10*b* is a voltage-amplitude response curve of a cross polarization (left-hand circular polarization) for an antenna array operating in a right-hand circular polarization at an operating frequency of 19.725 GHz.
Figure 11A:
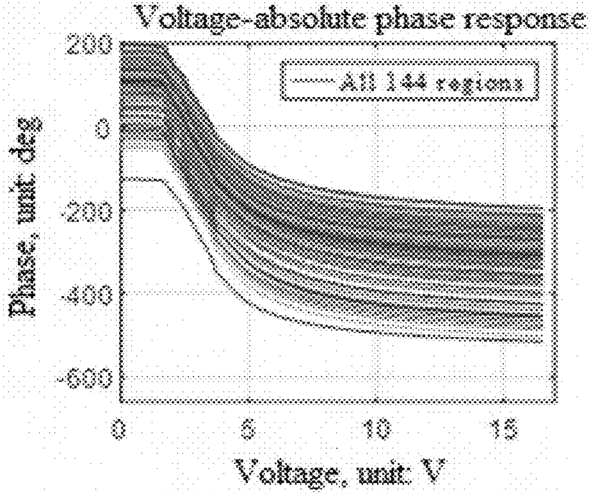
FIG. 11*a* is a voltage-absolute phase response curve of a main polarization (right-hand circular polarization) for an antenna array operating in the right-hand circular polarization at an operating frequency of 19.725 GHz.
Figure 11B:
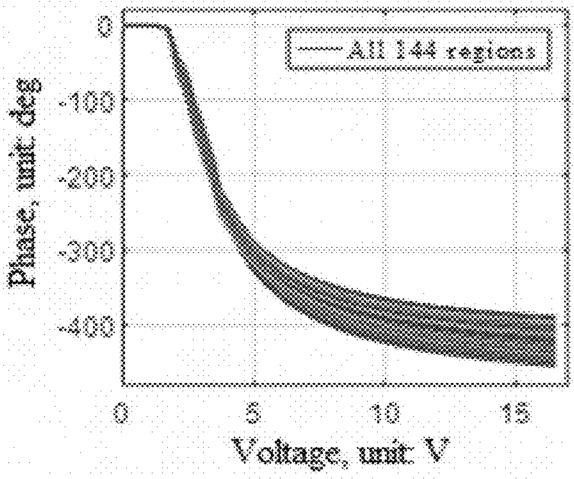
FIG. 11*b* is a voltage-absolute phase response curve of a cross polarization (left-hand circular polarization) for an antenna array operating in a right-hand circular polarization at an operating frequency of 19.725 GHz.
Figure 12A:
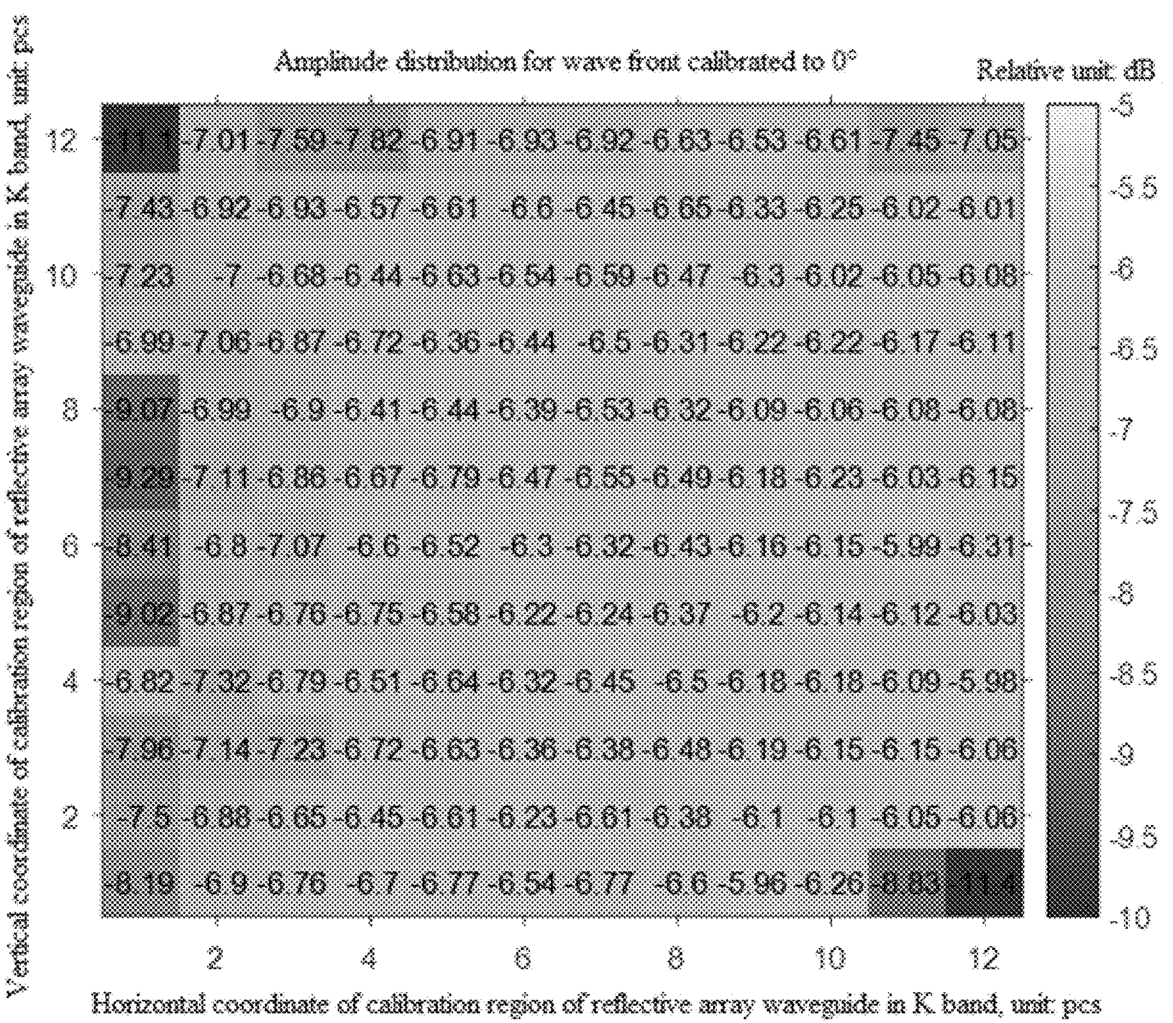
FIG. 12*a* shows an amplitude distribution for an antenna array operating in a right-hand circular polarization and calibrated to 0° at an operating frequency of 19.725 GHz.
Figure 12B:
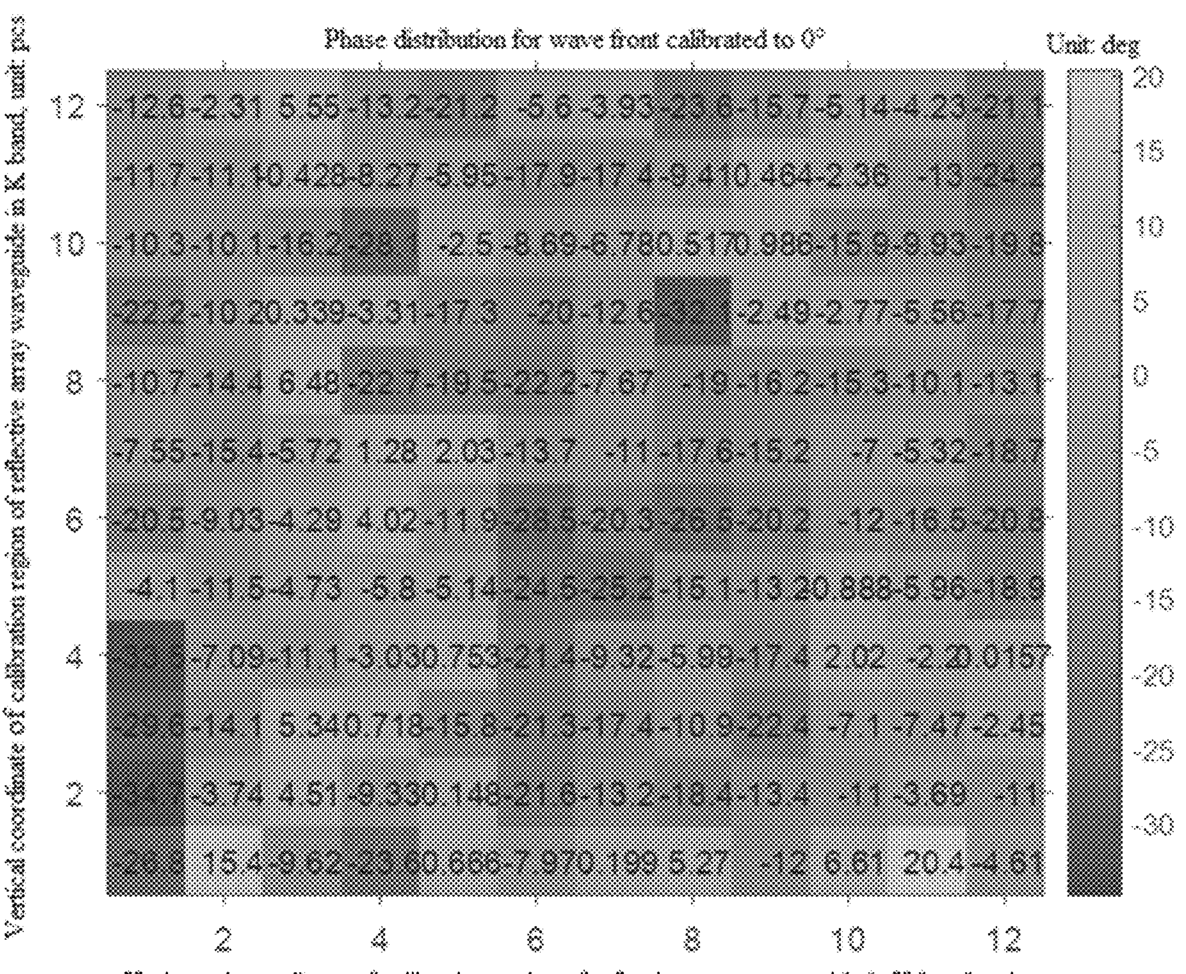
FIG. 12*b* shows a phase distribution for an antenna array operating in the right-hand circular polarization and calibrated to 0° at an operating frequency of 19.725 GHz.
Figure 13A:
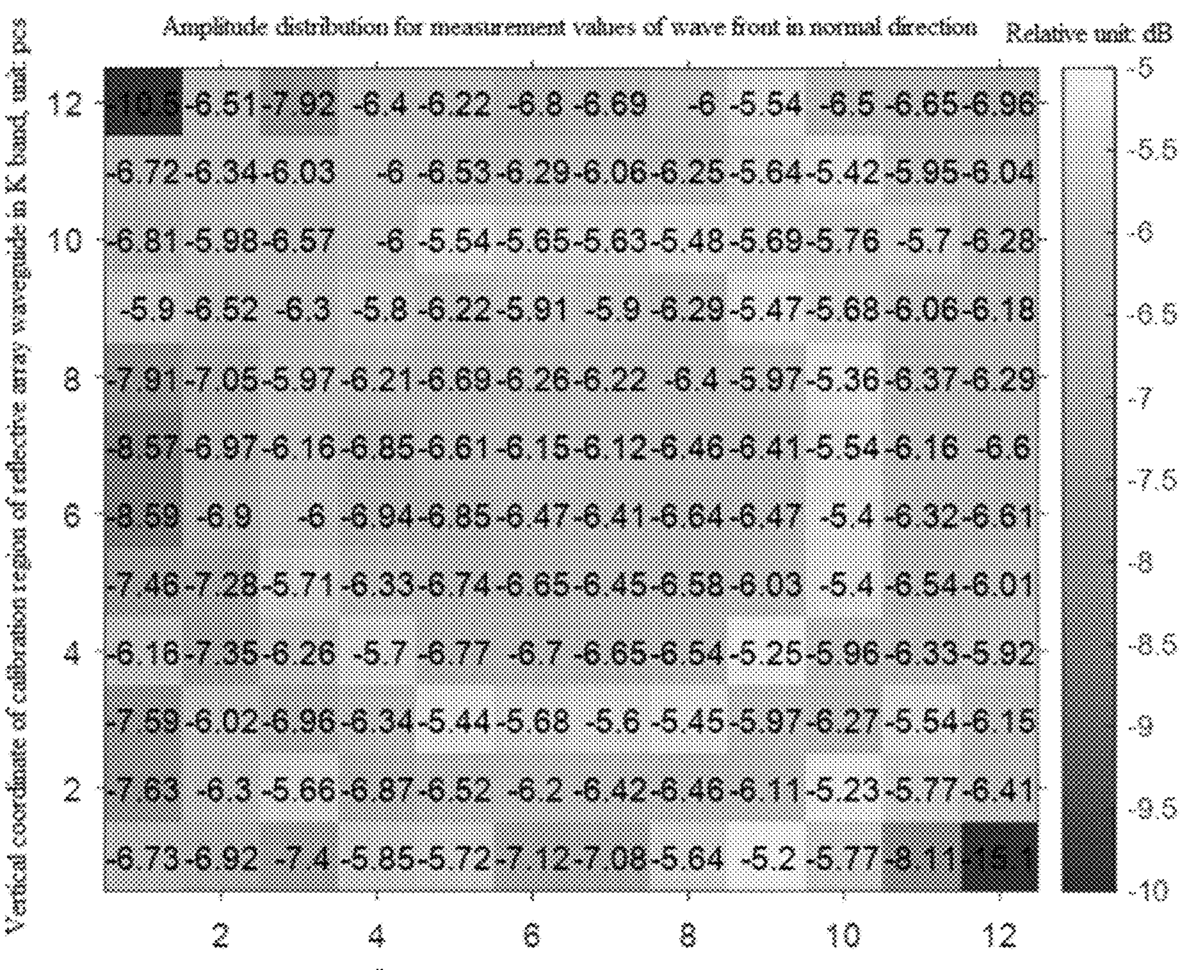
FIG. 13*a* shows an amplitude distribution for an antenna array operating in a right-hand circular polarization with a beam angle of 90° at an operating frequency of 19.725 GHz.
Figure 13B:
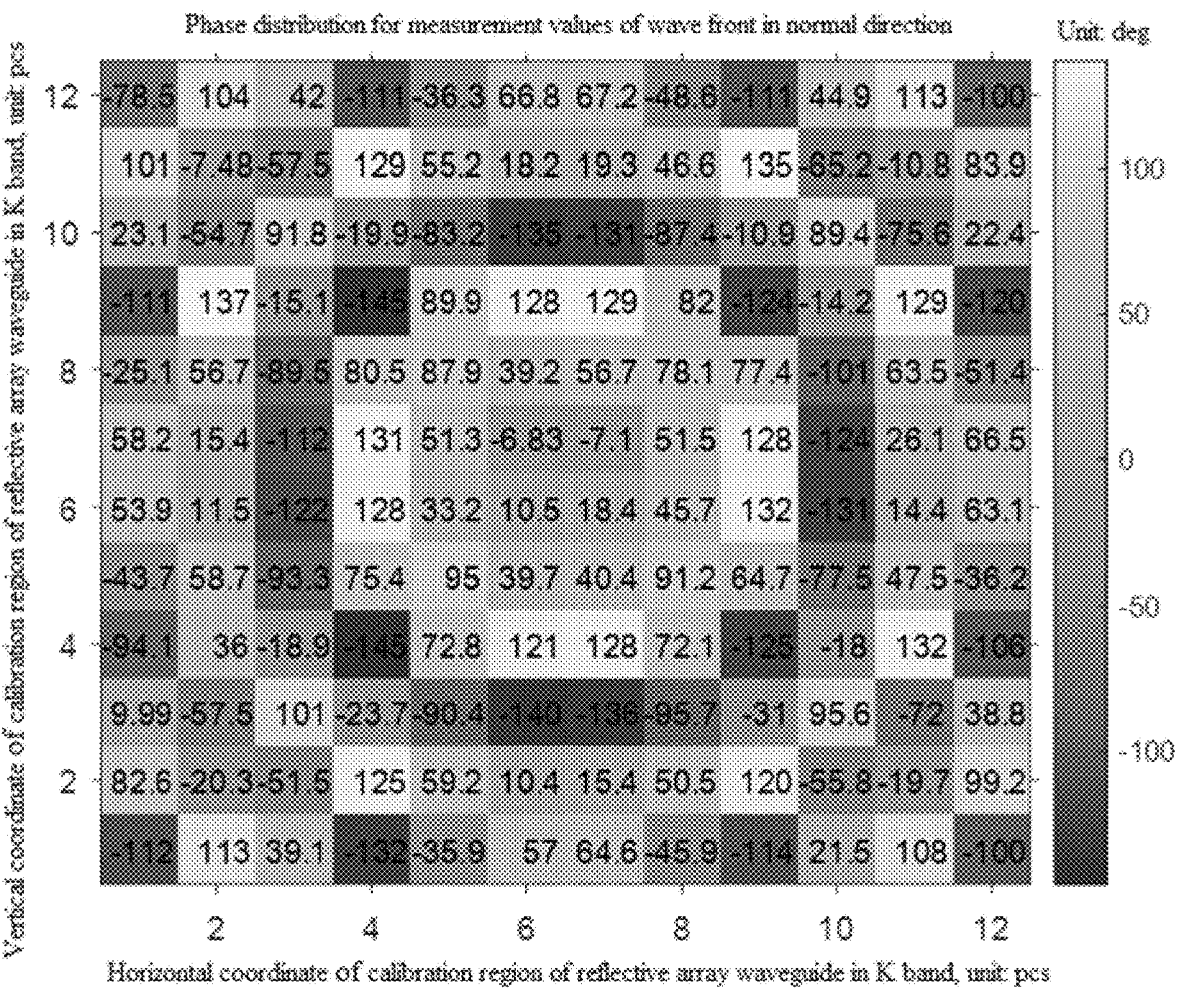
FIG. 13*b* shows a phase distribution for an antenna array operating in a right-hand circular polarization with a beam angle of 90° at an operating frequency of 19.725 GHz.
Figure 13C:
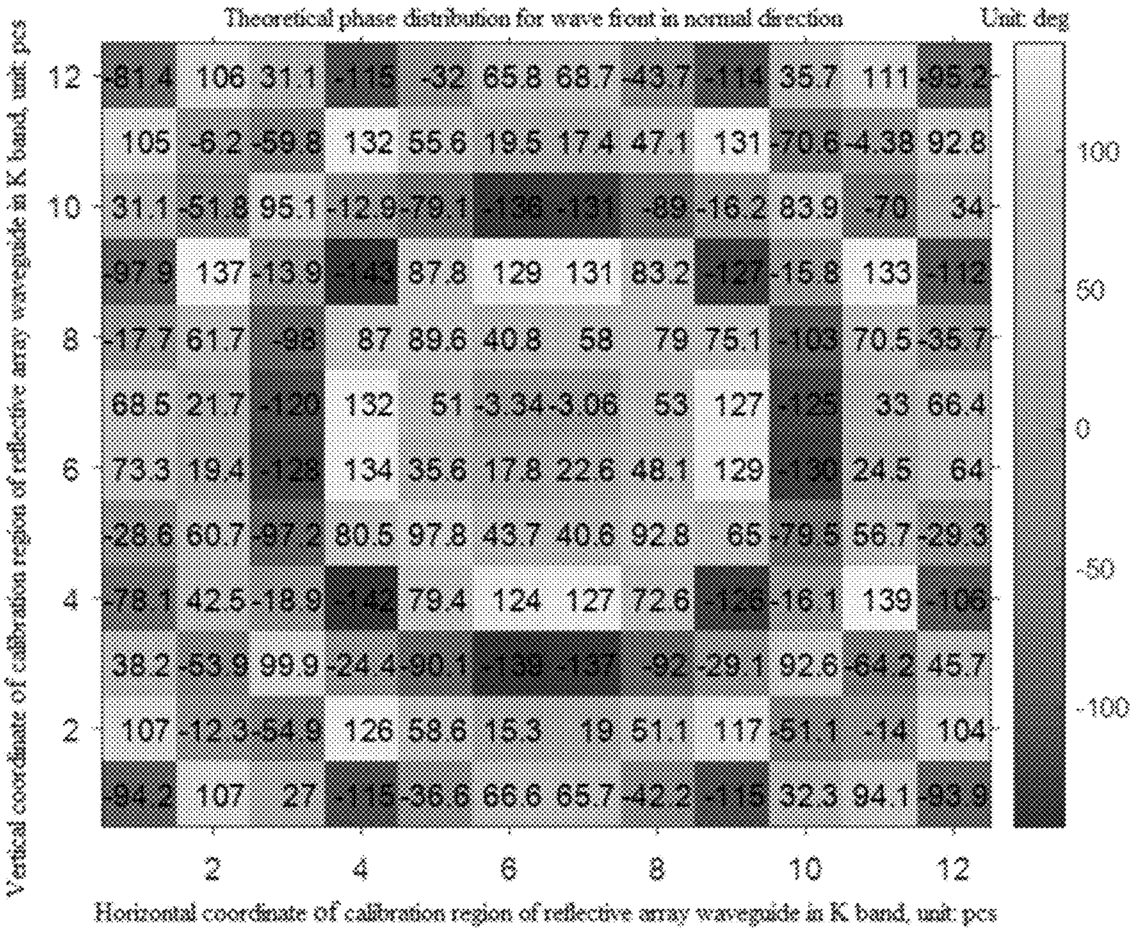
FIG. 13*c* shows a theoretical phase distribution for an antenna array operating in a right-hand circular polarization with a beam angle of 90° at an operating frequency of 19.725 GHz.
Figure 13D:
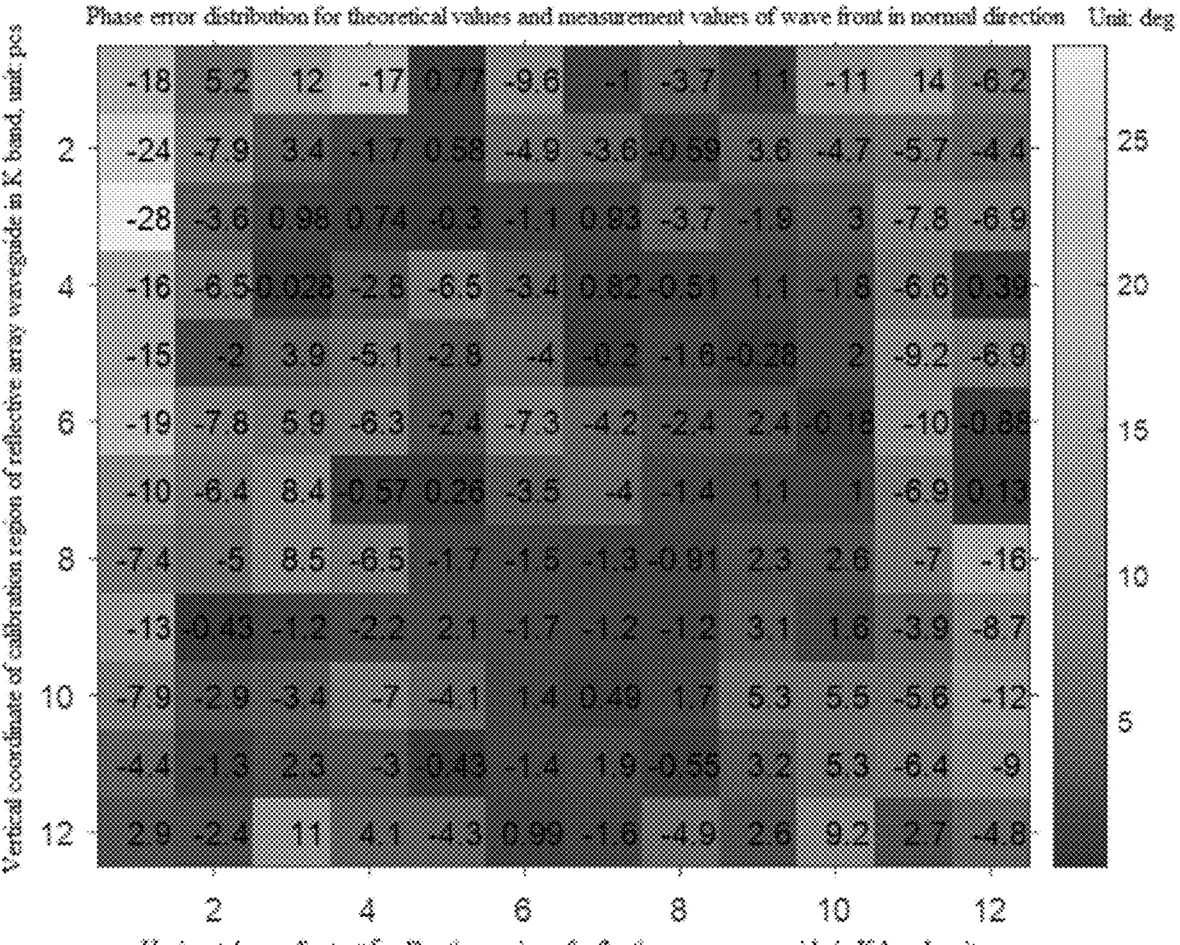
FIG. 13*d* shows a phase error distribution for an antenna array operating in a right-hand circular polarization with a beam angle of 90° at an operating frequency of 19.725 GHz.

According to the calibration method, an antenna array operating in the right-hand circular polarization at an operating frequency of 19.725 GHz is calibrated. When a beam pointing angle is 90° (in a normal direction), one of the in-array units 10 is a test region. Referring to FIGS. 10*a*, 10*b*, 11*a*, 11*b*, 12*a*, 12*b*, 13*a*, 13*b*, 13*c* and 13*d*, FIG. 10*a* is a voltage-amplitude response curve of a main polarization (right-hand circular polarization) for an antenna array operating in the right-hand circular polarization at an operating frequency of 19.725 GHz. FIG. 10*b* is a voltage-amplitude response curve of a cross polarization (left-hand circular polarization) for an antenna array operating in a right-hand circular polarization at an operating frequency of 19.725 GHz. FIG. 11*a* is a voltage-absolute phase response curve of a main polarization (right-hand circular polarization) for an antenna array operating in the right-hand circular polarization at an operating frequency of 19.725 GHz. FIG. 11*b* is a voltage-absolute phase response curve of a cross polarization (left-hand circular polarization) for an antenna array operating in a right-hand circular polarization at an operating frequency of 19.725 GHz. FIG. 12*a* shows an amplitude distribution for an antenna array operating in a right-hand circular polarization and calibrated to 0° at an operating frequency of 19.725 GHz. FIG. 12*b* shows a phase distribution for an antenna array operating in the right-hand circular polarization and calibrated to 0° at an operating frequency of 19.725 GHz. FIG. 13*a* shows an amplitude distribution for an antenna array operating in a right-hand circular polarization with a beam angle of 90° at an operating frequency of 19.725 GHz. FIG. 13*b* shows a phase distribution for an antenna array operating in a right-hand circular polarization with a beam angle of 90° at an operating frequency of 19.725 GHz. FIG. 13*c* shows a theoretical phase distribution for an antenna array operating in a right-hand circular polarization with a beam angle of 90° at an operating frequency of 19.725 GHz. FIG. 13*d* shows a phase error distribution for an antenna array operating in a right-hand circular polarization with a beam angle of 90° at an operating frequency of 19.725 GHz. An average value of errors is −2.6°, and a standard deviation of errors is 6.2°.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A waveguide probe structure, comprising a waveguide coaxial converter, a tapered waveguide and a first straight waveguide; wherein the waveguide coaxial converter is configured to transmit and receive two orthogonal linearly-polarized signals;

the tapered waveguide comprises a first waveguide cavity with a first waveguide port and a second waveguide port along a length direction of the first waveguide cavity, the first waveguide port is connected to the waveguide coaxial converter, the second waveguide port is connected to the first straight waveguide, and a size of a cross section of the first waveguide cavity increases monotonically in a direction from the first waveguide port to the second waveguide port; and the first straight waveguide comprises a second waveguide cavity, and a size of a cross section of the second waveguide cavity is equal to a size of the second waveguide port;

wherein the waveguide coaxial converter comprises a second straight waveguide, a first feeding port, a second feeding port, and an isolation component; and feeding directions of the first feeding port and the second feeding port are orthogonal to each other, the second straight waveguide comprises a third waveguide cavity, and the first feeding port, the second feeding port and the isolation component are all mounted on a side wall of the second straight waveguide and all extend into the third waveguide cavity, and the isolation component is between the first feeding port and the second feeding port and parallel to one of the first feeding port and the second feeding port; and wherein the waveguide probe structure further comprises a first fixing component mounted on the side wall of the second straight waveguide and comprising a plurality of mounting holes therein.

2. The waveguide probe structure of claim 1, wherein the first fixing component comprises a flange.

3. The waveguide probe structure of claim 1, wherein the tapered waveguide has a flare angle in a range from 1.5° to 2.5°.

4. The waveguide probe structure of claim 1, further comprising a spacer fixed on an end surface of the first straight waveguide away from the tapered waveguide.

5. The waveguide probe structure of claim 1, wherein a length of the first straight waveguide is greater than a wavelength corresponding to a central frequency of a microwave signal transmitted through the first straight waveguide.

6. A waveguide probe structure, comprising a waveguide coaxial converter, a tapered waveguide and a first straight waveguide; wherein the waveguide coaxial converter is configured to transmit and receive two orthogonal linearly-polarized signals;

the tapered waveguide comprises a first waveguide cavity with a first waveguide port and a second waveguide port along a length direction of the first waveguide cavity, the first waveguide port is connected to the waveguide coaxial converter, the second waveguide port is connected to the first straight waveguide, and a size of a cross section of the first waveguide cavity increases monotonically in a direction from the first waveguide port to the second waveguide port; and the first straight waveguide comprises a second waveguide cavity, and a size of a cross section of the second waveguide cavity is equal to a size of the second waveguide port, wherein the waveguide coaxial converter is fixedly connected to the tapered waveguide through a second fixing component; and wherein the second fixing component comprises a flange.

7. A calibration device for an antenna array, comprising a waveguide probe structure, a vector network analyzer and a controller; wherein the waveguide probe structure comprises a waveguide probe structure, and the waveguide probe structure comprises a waveguide coaxial converter, a tapered waveguide and a first straight waveguide; the waveguide coaxial converter is configured to transmit and receive two orthogonal linearly-polarized signals; the tapered waveguide comprises a first waveguide cavity with a first waveguide port and a second waveguide port along a length direction of the first waveguide cavity, the first waveguide port is connected to the waveguide coaxial converter, the second waveguide port is connected to the first straight waveguide, and a size of a cross section of the first waveguide cavity increases monotonically in a direction from the first waveguide port to the second waveguide port; and the first straight waveguide comprises a second waveguide cavity, and a size of a cross section of the second waveguide cavity is equal to a size of the second waveguide port;

the vector network analyzer is configured to transmit a microwave signal to an in-array unit to be calibrated through the waveguide probe structure under control of the controller, receive the microwave signal reflected by the in-array unit and transmitted through the waveguide probe structure, and obtain network parameters of the in-array unit based on a relationship between an incident microwave and a reflected microwave through analysis according to the received microwave signal; and the controller is configured to process the network parameters based on the relationship between the incident microwave and the reflected microwave obtained by the vector network analyzer through analysis, and obtain a calibration error through a preset algorithm.

8. A calibration method for an antenna array, wherein the method employs the calibration device of claim 7, the antenna array comprises M×N in-array units, where one of M and Nis a positive integer greater than or equal to 1, and the other one of M and N is a positive integer greater than or equal to 2;

wherein the method comprises:

sequentially calibrating the M×N in-array units based on a reference phase matching codebook acquired in advance, wherein the reference phase matching codebook comprises a correspondence between test voltages and reference amplitudes as well as reference phases, respectively;

calibrating an in-array unit in an ith row and a jth column comprises:

sequentially loading test voltages in the reference phase matching codebook to the in-array unit in the ith row and the jth column, and transmitting the microwave signal reflected by the in-array unit in the ith row and the jth column to the vector network analyzer through the waveguide probe structure after each test voltage is loaded, so that the vector network analyzer acquires the network parameters of the in-array unit in the ith row and the jth column based on the relationship between the incident microwave and the reflected microwave; where $0<i\leq M$, $0<j\leq N$, and i and j are positive integers;

analyzing the network parameters acquired by the vector network analyzer on the basis of the relationship between the incident microwave and the reflected microwave under different test voltages based on the in-array unit in the ith row and the jth column to obtain a first S parameter matrix; and processing, by the controller, the first S parameter matrix to obtain a normalized S parameter matrix of the in-array unit in the ith row and the jth column under each test voltage, and determining a target voltage absolute phase response curve and a target voltage amplitude response curve corresponding to the in-array unit in the ith row and the jth column, wherein the normalized S parameter matrix is used for representing the network parameters of the in-array unit in the ith row and the jth column on the basis of the relationship between the incident microwave and the reflected microwave under the test voltage.

9. The calibration method for an antenna array of claim 8, wherein the processing the first S parameter matrix to obtain the normalized S parameter matrix of the in-array unit in the ith row and the jth column under each test voltage comprises:

placing the waveguide probe structure above a reflective component, transmitting the microwave signal reflected by the reflective component to the vector network analyzer through the waveguide probe structure, so that the vector network analyzer obtains network parameters of the waveguide probe structure and the reflective component based on the relationship between the incident microwave signal and the reflected microwave signal through analysis;

determining, by the vector network analyzer, a second S parameter matrix based on the network parameters of the waveguide probe structure and the reflective component based on the relationship between the incident microwave signal and the reflected microwave signal through analysis; and subtracting, by the controller, vectors of the first S parameter matrix from vectors of the second S parameter matrix to obtain the normalized S parameter matrix of the in-array unit in the ith row and the jth column under each test voltage.

10. The calibration method for an antenna array of claim 8, wherein an operating mode of the antenna array is a circular polarization, and the determining the target voltage absolute phase response curve and the target voltage amplitude response curve corresponding to the in-array unit in the ith row and the jth column comprises:

performing a linear-circular polarization basis transformation on the normalized S parameter matrix, and determining the target voltage absolute phase response curve and the target voltage amplitude response curve corresponding to the in-array unit in the ith row and the jth column.

11. The calibration method for an antenna array of claim 8, further comprising obtaining a reference phase matching codebook; wherein the reference phase matching codebook comprises a correspondence response curve of the test voltages versus the reference phases of each in-array unit and a correspondence response curve of the test voltages versus the reference amplitude of each in-array unit;

acquiring the correspondence response curve of the test voltages versus the reference phases of the in-array unit in the ith row and the jth column and a correspondence response curve of the test voltages versus the reference amplitudes of the in-array unit in the ith row and the jth column comprises:

sequentially loading test voltages in a test voltage set acquired in advance to the in-array unit in the ith row and the jth column, placing the waveguide probe structure above the in-array unit in the ith row and the jth column, and obtaining, by the vector network analyzer, network parameters of the in-array unit in the ith row and the jth column and the waveguide probe structure based on the relationship between the incident microwave and the reflected microwave through the waveguide probe structure through analysis, to determine a first reference S parameter matrix; where $0<i\leq M$, $0<j\leq N$, and i and j are positive integers;

placing the waveguide probe structure above a reflective component, and obtaining, by the vector network analyzer, network parameters of the reflective component and the waveguide probe structure on the basis of the relationship between the incident microwave and the reflected microwave through analysis, to determine a second reference S parameter matrix; and obtaining, by the controller, a normalized reference S parameter matrix based on the first reference S parameter matrix and the second reference S parameter matrix, processing the normalized reference S parameter matrix, and determining the correspondence response curve of the test voltages versus the reference phases of the in-array unit in the ith row and the jth column and the correspondence response curve of the test voltages versus the reference amplitudes of the in-array unit in the ith row and the jth column.

12. The calibration method for an antenna array of claim 8, wherein the reflective component is made of copper or aluminum.

13. The calibration device of claim 7, wherein the waveguide coaxial converter comprises a second straight waveguide, a first feeding port, a second feeding port, and an isolation component; and feeding directions of the first feeding port and the second feeding port are orthogonal to each other, the second straight waveguide comprises a third waveguide cavity, and the first feeding port, the second feeding port and the isolation component are all mounted on a side wall of the second straight waveguide and all extend into the third waveguide cavity, and the isolation component is between the first feeding port and the second feeding port and parallel to one of the first feeding port and the second feeding port.

14. The calibration device of claim 13, further comprising a first fixing component mounted on the side wall of the second straight waveguide and comprising a plurality of mounting holes therein.

15. The calibration device of claim 14, wherein the first fixing component comprises a flange.

16. The calibration device of claim 7, wherein the waveguide coaxial converter is fixedly connected to the tapered waveguide through a second fixing component.

17. The calibration device of claim 16, wherein the second fixing component comprises a flange.

* * * * *